United States Patent
Galy et al.

(10) Patent No.: US 8,164,871 B2
(45) Date of Patent: Apr. 24, 2012

(54) CIRCUIT FOR PROTECTING AN INTEGRATED CIRCUIT AGAINST ELCTROSTATIC DISCHARGES IN CMOS TECHNOLOGY

(75) Inventors: Philippe Galy, Colombes (FR); Christophe Entringer, Brignoud (FR); Alexandre Dray, Moretel de Mailles (FR)

(73) Assignee: STMicroelectronics SA, Montrouge (FR)

( * ) Notice: Subject to any disclaimer, the term of this patent is extended or adjusted under 35 U.S.C. 154(b) by 68 days.

(21) Appl. No.: 12/506,477

(22) Filed: Jul. 21, 2009

(65) Prior Publication Data

US 2010/0027174 A1    Feb. 4, 2010

(30) Foreign Application Priority Data

Aug. 4, 2008    (FR) ..................... 08 55383

(51) Int. Cl.
*H02H 3/22* (2006.01)
(52) U.S. Cl. ........................ 361/56; 361/111
(58) Field of Classification Search .............. 361/56, 361/111; 257/355–360
See application file for complete search history.

(56) References Cited

U.S. PATENT DOCUMENTS

| | | | |
|---|---|---|---|
| 4,199,774 A | 4/1980 | Plummer | 357/41 |
| 6,226,162 B1 * | 5/2001 | Kladar et al. | 361/56 |
| 6,236,087 B1 | 5/2001 | Daly et al. | 257/355 |
| 6,594,132 B1 | 7/2003 | Avery | 261/111 |
| 6,639,779 B2 * | 10/2003 | Knigge et al. | 361/119 |
| 6,765,771 B2 * | 7/2004 | Ker et al. | 361/56 |
| 7,440,248 B2 * | 10/2008 | Arai et al. | 361/56 |
| 2003/0076640 A1 | 4/2003 | Malherbe et al. | 361/56 |
| 2004/0207021 A1 | 10/2004 | Russ et al. | 257/355 |
| 2006/0209478 A1 | 9/2006 | Arai et al. | 261/56 |
| 2008/0044955 A1 * | 2/2008 | Salcedo et al. | 438/140 |

FOREIGN PATENT DOCUMENTS

JP    2006074012    3/2006

* cited by examiner

*Primary Examiner* — Danny Nguyen
(74) *Attorney, Agent, or Firm* — Allen, Dyer, Doppelt, Milbrath & Gilchrist, P.A.

(57) ABSTRACT

The integrated circuit may include at least one electronic protection circuit for protecting against at least one electrostatic discharge and being able to discharge the overvoltage current generated by the electrostatic discharge. The electronic protection circuit includes a controlled short-circuiting switch embodied in CMOS technology including a CMOS technology TRIAC or a CMOS technology thyristor arranged in anti-parallel with a CMOS technology diode, and a triggering circuit for controlling the short-circuiting switch.

5 Claims, 1 Drawing Sheet

CIRCUIT FOR PROTECTING AN INTEGRATED CIRCUIT AGAINST ELCTROSTATIC DISCHARGES IN CMOS TECHNOLOGY

FIELD OF THE INVENTION

The present invention relates to microelectronics, and more particularly, to the protecting an integrated circuit against electrostatic discharges or other overvoltages.

BACKGROUND OF THE INVENTION

Integrated circuits are particularly sensitive to disturbances, such as electrostatic disturbances, that may greatly impair the operation of the circuits. These electrostatic disturbances impact the integrated circuit in the form of excess positive or negative charges. These excess charges may be discharged by lines enabling the circuit leading to the core of the integrated circuit to be short-circuited so as not to create a build up of charge at a vital point of the circuit, thereby preventing the core of the circuit from being damaged.

To discharge such a surplus of charge from the circuit, it may be necessary to construct an electrical path that is less resistive than the electrical path circuit leading to the core of the integrated circuit so as to favor the flow of surplus charges through this path rather than through the circuit leading to the core of the integrated circuit.

For this purpose, it is typical for the person skilled in the art to make a circuit for protecting an integrated circuit from electrostatic discharges with the aid of a short-circuiting switch comprising a field-effect transistor arranged in parallel with a diode and controlled by a time triggering circuit, known as a metal oxide semiconductor switch (MOSSWI). This technology is nonetheless space consuming in terms of silicon real estate consumed in the integrated circuit.

In view of the foregoing, it may be desirable that the effectiveness of the circuit for protecting the integrated circuit against electrostatic discharges be improved and that the size of this additional circuit, which is helpful to the operation of the integrated circuit, be reduced.

SUMMARY OF THE INVENTION

According to one aspect, an integrated circuit may include at least one means of electronic protection or an electronic protection circuit against at least one electrostatic discharge and being able to discharge an overvoltage current generated by the electrostatic discharge.

The electronic protection means comprises at least one controlled short-circuiting switch embodied in complementary metal-oxide-semiconductor (CMOS) technology comprising a CMOS technology TRIode for Alternating Current (TRIAC) or a CMOS technology thyristor arranged in anti-parallel with a CMOS technology diode, and triggering means or a triggering circuit for controlling the short-circuiting switch.

The two CMOS technologies cited above may offer a significant space saving in comparison with the MOSSWI switch. Indeed, the short-circuiting switch comprising the CMOS technology thyristor arranged in anti-parallel with the CMOS technology diode makes it possible to obtain a ten percent reduction of the silicon real estate occupied with respect to the MOSSWI switch. The short-circuiting switch comprising the CMOS technology TRIAC enables reduction by a factor of 20 the space occupied in comparison with the MOSSWI switch.

Preferably, the CMOS technology thyristor includes a first semiconductor substrate of a first type of conductivity comprising a first well of semiconductor substrate of a second type of conductivity and a second well of semiconductor substrate of the first type of conductivity. The first well and the second well each may comprise a first active zone doped according to the second type of conductivity and a second active zone doped according to the first type of conductivity. The CMOS thyristor may comprise a first connection coupled to the first active zone of the second well, a second connection coupled to the second active zone of the first well, a third connection coupled to the second active zone of the second well, and a fourth connection coupled to the first active zone of the first well.

The CMOS technology thyristor is not made like the thyristors typically used comprising a first well of semiconductor substrate of a first type of conductivity comprising a first active zone doped according to a second type of conductivity and a second active zone doped according to the first type of conductivity, the first well being adjoined to a second well of semiconductor substrate of a second type of conductivity comprising a first zone doped according to the second type of conductivity and a second zone doped according to the first type of conductivity. In the CMOS technology thyristor of the invention, the first semiconductor substrate of the first type of conductivity may include a first well of semiconductor substrate of a second type of conductivity, and a second well of semiconductor substrate of the first type of conductivity. This first semiconductor substrate makes it possible to insulate the thyristor and thus obtain homogeneous triggering by the short-circuiting switch as well as auto-immunity to the phenomenon of latch-up, by discharging the electrons inducing the latch-up currents through the third connection.

Moreover, the third connection coupled to the second active zone of the second well and the fourth connection coupled to the first active zone of the first well offer several possibilities for controlling the triggering of the thyristor. Specifically, the triggering may be controlled via the third connection, via the fourth connection, or via both connections simultaneously with the aid of one and the same triggering circuit.

The CMOS technology TRIAC may comprise an insulating region of a first type of conductivity having a first well and a second well of the second type of conductivity, the wells being separated by a region of separation of the first type of conductivity made in the insulating region. The two wells each may comprise a first active zone doped according to the second type of conductivity and a second active zone doped according to the first type of conductivity. The separation region may comprise an active zone doped according to the first type of conductivity.

The use of a TRIAC as short-circuiting switch allows an even more significant saving of room than the short-circuiting switch comprising a thyristor and a diode, and its effectiveness is also increased. In the CMOS technology TRIAC, a first insulating region of the first type of conductivity, in which are made a first well of semiconductor substrate of a second type of conductivity and a second well of semiconductor substrate of the first type of conductivity, makes it possible to insulate the TRIAC and thus obtain homogeneous triggering of the short-circuiting switch as well as auto-immunity to the phenomenon of latch-up.

Advantageously, a TRIAC is equivalent to the arrangement of two thyristors arranged in anti-parallel, but in one and the same thermal dissipation volumes. That is to say, the volume occupied by the TRIAC is equivalent to the volume occupied by two thyristors. In the case of the TRIAC, the whole volume of the component is used in its entirety as a thermal energy dissipater in both directions of conduction, that is to say, the volume equivalent to two thyristors. An arrangement comprising two thyristors arranged in anti-parallel uses only the volume occupied by a thyristor to dissipate the heat generated in respect of one direction of conduction and the occupied volume of the second thyristor to dissipate the heat produced in respect of the second direction of conduction.

Moreover, the TRIAC advantageously makes it possible to have just a single trigger gate for controlling the device for either of the polarities of the current. Moreover, this bidirectional controlled electronic switch allows an obvious savings of room. It also makes it possible to obtain better efficiency, given that the same component is used to discharge the overload current in both polarities of the current.

Advantageously, the TRIAC comprises a first connection coupled both to the first active zone and to the second active zone of a well of the second type of conductivity, a second connection coupled both to the first active zone and to the second active zone of another well of the second type of conductivity, and a third connection coupled to the insulating region via the active zone of the separation region. The first active zone and the second active zone, which are coupled to the first connection of the TRIAC, are advantageously disposed in the first well of the TRIAC. The first active zone and the second active zone, which are coupled to the second connection of the TRIAC, are preferably disposed in the second well of the TRIAC.

According to another aspect, a method is for operating at least one means of electronic protection or an electronic protection circuit against at least one electrostatic discharge and discharging an overvoltage current generated by the electrostatic discharge. The electronic protection means may comprise at least one controlled short-circuiting switch having controlled CMOS switches, for example, a CMOS TRIAC or a CMOS thyristor arranged in anti-parallel with a CMOS technology diode.

For the CMOS technology thyristor, a first semiconductor substrate of a first type of conductivity is made. The first semiconductor substrate may include a first well of the second type of conductivity, and a second well of the first type of conductivity. The first well and the second well each may comprise an active zone doped according to the second type of conductivity, and an active zone doped according to the first type of conductivity. The CMOS technology thyristor may comprise a first connection coupled the first active zone of the second well, a second connection coupled to the second active zone of the first well, a third connection coupled to the second active zone of the second well, and a fourth connection coupled to the first active zone of the first well.

For the CMOS TRIAC, an insulating region of a first type of conductivity is made. The insulating region may include a first well, and a second well of the second type of conductivity, the wells being separated by a region of separation of the second type of conductivity. The two wells may each comprise a first active zone doped according to the second type of conductivity, a second active zone doped according to the first type of conductivity, and the separation region comprising an active zone doped according to the first type of conductivity.

Advantageously, a first connection coupled both to the first active zone and to the second active zone of the first well is made. A second connection is coupled both to the first active zone and to the second active zone of the second well. A third connection is coupled to the insulating region via the active zone of the separation region.

BRIEF DESCRIPTION OF THE DRAWINGS

Other advantages and characteristics of the invention may become apparent on examining the detailed description of wholly non-limiting embodiments and modes of implementation, and the appended drawings, in which.

DETAILED DESCRIPTION OF THE PREFERRED EMBODIMENTS

Figure 1:
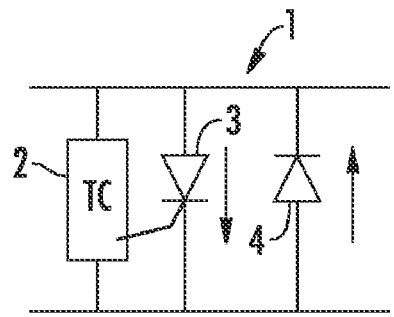
FIG. 1 illustrates a short-circuit switch electronic circuit, according to the present invention.
Figure 2:
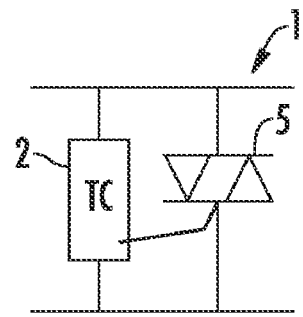
FIG. 2 illustrates another embodiment of the short-circuit switch electronic circuit, according to the present invention.

FIGS. 1 and 2 illustrate two examples of an electronic circuit of an arrangement of two short-circuiting switches according to two different embodiments. These electrical circuits are intended to afford protection against one or more successive electrostatic discharges.

Represented in FIG. 1 is a short-circuiting switch 1 comprising a triggering circuit 2, a thyristor 3 controlled by the triggering circuit 2, and a diode 4 arranged in anti-parallel with the thyristor 3. The thyristor 3 conducts the current for one polarity of the current while the diode 4 conducts the current in the opposite polarity of the current.

Represented in FIG. 2 is a short-circuiting switch 1 also comprising a triggering circuit 2 controlling a TRIAC 5 which conducts the current for either of the polarities of the current.

Figure 3:
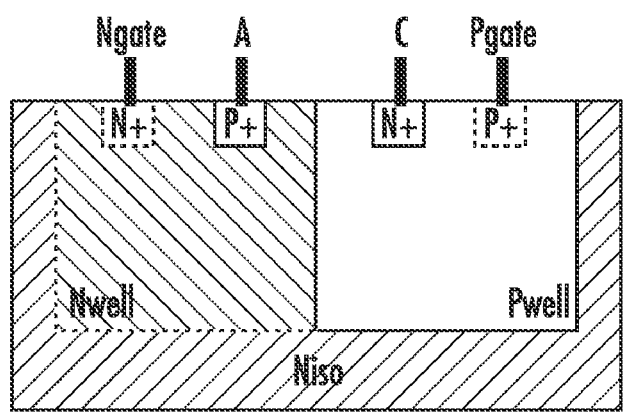
FIG. 3 is a schematic diagram of a cross-sectional view of a CMOS technology thyristor, according to the present invention.

FIG. 3 illustrates a schematic sectional view of a CMOS technology thyristor according to an embodiment of the invention. A first semiconductor substrate Niso of a first type of conductivity, in this example it is doped negatively, defines the base of the CMOS technology thyristor. In this first substrate Niso, a first well Pwell of semiconductor substrate of a second type of conductivity is made together with a second well Nwell of semiconductor substrate of the first type of conductivity. The well Nwell being of the same conductivity as the first substrate Niso, i.e. doped negatively. These two elements of the thyristor are formed from the same substrate, i.e. the first substrate Niso, and form one and the same substrate Niso/Nwell through which the electrons travel freely.

The first well Pwell and the second well Nwell each comprise a first active zone P+ doped positively in this example and a second active zone N+ doped negatively in this example. These active zones of the thyristor are coupled to four different connections allowing the operation of the CMOS technology thyristor with the remainder of the circuit. The thyristor comprises a first connection A corresponding to the anode of the thyristor and coupled to the first active zone P+ of the second well Nwell, a second connection C corresponding to the cathode of the thyristor and coupled to the second active zone N+ of the first well Pwell, a third connection Ngate coupled to the second active zone N+ of the second well Nwell, and a fourth connection Pgate coupled to the first active zone P+ of the first well Pwell.

The thyristor can be controlled from a triggering circuit by the third connection Ngate or the fourth connection Pgate, or even by both at the same time via the same triggering circuit. If the triggering of the thyristor is controlled via the connection Ngate, in this case, it is possible to short-circuit the connection Pgate by coupling it, for example, directly to the cathode. If on the other hand the triggering of the thyristor is controlled via the connection Pgate, it is possible this time to short-circuit the connection Ngate by coupling it, for example, directly to the anode. Finally, if one wishes to control the triggering of the thyristor via the two connections Ngate and Pgate, then in this case both connections are connected to the circuit same triggering circuit.

Figure 4:
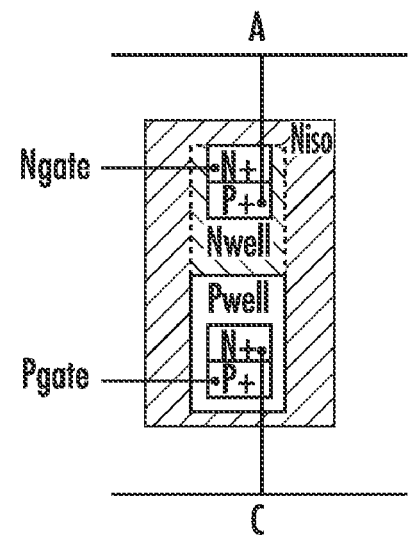
FIG. 4 is a schematic diagram of a CMOS technology TRIAC from FIG. 3.

FIG. 4 is a schematic representation of the diagram of a CMOS technology thyristor, such as embodied according to the example previously referred to in FIG. 3. The first semiconductor substrate Niso, doped negatively in this example, encompasses all the other parts comprising the thyristor, thereby allowing insulation of the thyristor from any element foreign to this component. Consequently, the time triggering controlled by the time triggering circuit via the connection Ngate coupled to the thyristor by the substrate N+/Niso/Nwell, or by the connection Pgate coupled to the thyristor by the first active zone P+ of the first well Pwell, or by the two connections Ngate and Pgate simultaneously, is more homogeneous than by using a conventional thyristor not possessing any first substrate Niso insulating it from outside disturbances.

Figure 5:
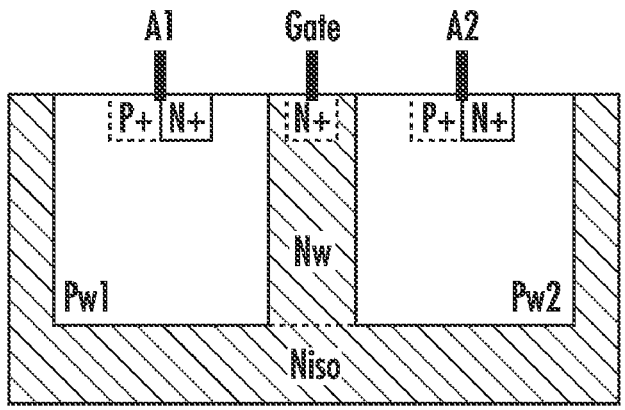
FIG. 5 is a schematic diagram of a cross-sectional view of a MOS TRIAC, according to the present invention.

FIG. 5 illustrates schematically a sectional view of a CMOS technology TRIAC according to an embodiment. A semiconductor substrate comprising an insulating region Niso/Nw/N+ of a first type of conductivity comprises the base of the TRIAC. The insulating region Niso/Nw/N+ is doped negatively in this example. In this first insulating region Niso/Nw/N+ of the semiconductor substrate, a first well Pw1 of the second type of conductivity, i.e. doped positively in this example, is made together with a second well Pw2 also of the second type of conductivity, i.e. in this example, doped positively. These two wells Pw1 and Pw2, both doped positively, are separated by a region Nw of the first type of conductivity, i.e. doped negatively, made in the insulating region Niso which is of the same type of conductivity. Thus, there is a common negative conductivity region Niso/Nw/N+.

The first well Pw1 and the second well Pw2 each comprise a first zone doped positively in this example and a second active zone N+ doped negatively in this example. The separation region Nw also comprises an active zone N+ doped according to the first type of conductivity, i.e. doped negatively.

These active zones P+ and N+ of the two wells Pw1 and Pw2 and of the separation region Nw of the TRIAC are coupled to three different connections allowing the operation of the CMOS technology TRIAC with the remainder of the circuit. The TRIAC comprises a first connection A1 coupled both to the first active zone P+ and to the second active zone N+ of the first well Pw1, a second connection A2 coupled both to the active zone P+ and to the active zone N+ of the second well Pw2, and a third connection Gate coupled to the active zone N+ of the separation region Nw, which forms part of the insulating region Niso/Nw/N+.

Figure 6:
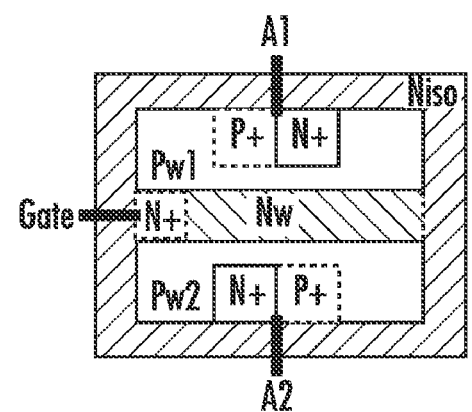
FIG. 6 is a schematic diagram of a CMOS technology TRIAC from FIG. 5.

FIG. 6 is an electronic representation of the diagram of a CMOS technology TRIAC such as embodied according to the example previously referred to in FIG. 5. The insulating region Niso/Nw/N+ of the semiconductor substrate encompasses all the other parts comprising the TRIAC, thereby allowing insulation of the CMOS technology TRIAC from any outside disturbance. Therefore the time triggering, controlled by the time triggering circuit via the connection Gate coupled to the TRIAC by the substrate Niso/Nw/N+, is more homogeneous than using a conventional TRIAC without any insulating region Niso/Nw/N+ insulating it from outside disturbances.

The structure improves the effectiveness of the circuit for protecting an integrated circuit from electrostatic discharges and reduces the space occupied while guaranteeing good thermal dissipation by such a controlled short-circuiting switch indispensable for protecting integrated circuits against electrostatic discharges.

That which is claimed:

1. An integrated circuit (IC) comprising:
   at least one electrostatic discharge protection circuit comprising
      at least one complementary metal-oxide-semiconductor (CMOS) short-circuit switch including a CMOS triode for alternating current (TRIAC), and
      a triggering circuit for controlling said at least one CMOS short-circuit switch;
   said CMOS TRIAC comprising
      an isolating region of a first conductivity type,
      a first well of a second conductivity type and being positioned in said isolating region, and
      a second well of the second conductivity type and also being positioned in said isolating region,
      said isolating region defining a separating portion between said first and second wells.

2. The IC according to claim 1 wherein said first and second wells each comprise a first active zone doped according to the second conductivity type and a second active zone doped according to the first conductivity type; and wherein the separating portion comprises a third active zone doped according to the first conductivity type.

3. The IC according to claim 2 wherein said CMOS TRIAC comprises:
   a first connection being coupled both to said first active zone and to said second active zone of said first well of the second conductivity type;
   a second connection being coupled both to said first active zone and to said second active zone of said second well of the second conductivity type; and
   a third connection being coupled to the isolating region via the third active zone of the separating portion.

4. A method of operating an electrostatic discharge protection circuit on an integrated circuit (IC), the method comprising:
   providing at least one complementary metal-oxide-semiconductor (CMOS) short-circuit switch including a CMOS triode for alternating current (TRIAC); and
   controlling the at least one CMOS short-circuit switch with a triggering circuit, the CMOS TRIAC comprising
      an isolating region of a first conductivity type,
      a first well of a second conductivity type and being positioned in the isolating region, and
      a second well of the second conductivity type and also being positioned in the isolating region,
      the isolating region defining a separating portion between the first and second wells.

5. The method according to claim 4 further comprising:
   coupling a first connection to the first active zone and to the second active zone of the first well of the second conductivity type;
   coupling a second connection to both the first active zone and to the second active zone of the second well of the second conductivity type; and
   coupling a third connection to the isolating region via the third active zone of the separating portion.

* * * * *